(12) United States Patent
Kamijima et al.

(10) Patent No.: US 8,247,029 B2
(45) Date of Patent: Aug. 21, 2012

(54) METHOD FOR FORMING MICROPATTERN

(75) Inventors: Akifumi Kamijima, Tokyo (JP); Hideyuki Yatsu, Tokyo (JP); Hitoshi Hatate, Tokyo (JP)

(73) Assignee: TDK Corporation, Tokyo (JP)

( * ) Notice: Subject to any disclaimer, the term of this patent is extended or adjusted under 35 U.S.C. 154(b) by 439 days.

(21) Appl. No.: 12/140,748

(22) Filed: Jun. 17, 2008

(65) Prior Publication Data
US 2009/0311424 A1  Dec. 17, 2009

(51) Int. Cl.
C23C 16/00 (2006.01)
(52) U.S. Cl. ............... 427/248.1; 427/249.1
(58) Field of Classification Search ............ 427/248.1, 427/249.1
See application file for complete search history.

(56) References Cited

U.S. PATENT DOCUMENTS

| | | | | |
|---|---|---|---|---|
| 4,576,903 A * | 3/1986 | Baron et al. | | 430/331 |
| 6,214,409 B1 * | 4/2001 | Mitani et al. | | 427/68 |
| 2002/0000613 A1 * | 1/2002 | Ohtani et al. | | 257/347 |
| 2003/0231426 A1 * | 12/2003 | Sato | | 360/126 |
| 2007/0111373 A1 * | 5/2007 | Ueda | | 438/105 |
| 2009/0170326 A1 * | 7/2009 | Jung | | 438/694 |

FOREIGN PATENT DOCUMENTS

| | | |
|---|---|---|
| JP | 2001-189302 | 7/2001 |
| JP | 2003-179064 | 6/2003 |
| JP | 2006-111504 | 4/2006 |

* cited by examiner

Primary Examiner — Kelly M Gambetta
(74) Attorney, Agent, or Firm — Oblon, Spivak, McClelland, Maier & Neustadt, L.L.P.

(57) ABSTRACT

The micropattern formation of the invention comprises forming a resist pattern, and then forming a carbon-containing film on the surface of the resist pattern, followed by ashing of the carbon-containing film and a portion of the resist surface constituting the resist pattern. Thus, the discharge state of ashing just after the initiation of discharge is so stabilized that the ashing rate distribution can be improved, and sensitive pattern slimming can be implemented with ease and high precision.

20 Claims, 2 Drawing Sheets

METHOD FOR FORMING MICROPATTERN

FIELD OF THE INVENTION

The present invention relates generally to a micro-pattern formation process capable of forming a micro-pattern of size much finer than determined by optical limits, and more particularly to a micropattern formation process that less varies in the width of the ensuing fine size and is much improved in terms of controllability for maintaining fine size precision.

EXPLANATION OF THE PRIOR ART

Dry etching is available as one method of how to form finely patterned thin films (micropatterns). Typically, this dry etching process comprises forming a thin film on a substrate, coating and forming a resist layer on the thin film, patterning this resist layer by photo-lithography to form a finely patterned resist mask, using this resist mask as a dry etching mask to remove a portion of the thin film exposed, and stripping off the resist to obtain a thin film with a micropattern formed on it.

Thin films having micropatterns formed by such drying etching, for instance, are used for microparts, microlayer members, interconnecting patterns, etc. forming part of microdevices exemplified by thin-film inductors, thin-film magnetic heads, semiconductor devices, sensors harnessing thin films, actuators tapping thin films, etc.

With recent trends for microdevices toward having much smaller size, there is a mounting demand for technologies for making pattern width much smaller than ever before, and for active light rays used for mask pattern formation, too, irradiation light of short wavelengths such as KrF, ArF, $F_2$ excimer laser light and electron radiation are now under research and development, and even practically applied.

With the prior art dry etching, however, it is still theoretically impossible to form pattern thin films much finer than optically limited size, because the resist layer is patterned by an optical method, and the resultant resist pattern is used as a dry etching mask to form a micropattern thin film.

There is one method—called the ashing technique—for solving such a problem available wherein to slim down the width of a resist pattern, the surface of the resist is exposed to oxygen plasma or the like to decompose and remove it in a vapor phase.

Generally, a problem with ashing that can be used for making pattern much finer is, however, that discharge runs over the surface of the resist at the time of oxygen plasma discharge, and the rate of ashing differs in that position, resulting in variations in the precision of the ensuing resist width and a worsening of the distribution of the resist width. Another problem arises in conjunction with the ashing rate (initial ashing rate) just after the initiation of ashing; that ashing rate is higher than the subsequent one, rendering the sensitive slimming of the pattern difficult.

The situations being like such, the invention has been accomplished for the purpose of providing a micro-pattern formation process capable of forming a pattern of size much finer than optically limited size, wherein (1) the discharge state of ashing just after the initiation of discharge is stabilized to improve on an ashing rate distribution and (2) the sensitive slimming of the pattern can be implemented with ease and high precision.

SUMMARY OF THE INVENTION

According to the invention, such an objects as described above is accomplishable by the provision of a micropattern formation process, comprising forming a resist pattern, and then forming a carbon-containing film on the surface of the resist pattern, followed by ashing of said carbon-containing film and a portion of the resist surface constituting said resist pattern.

In a preferable embodiment of the inventive micro-pattern formation process, said carbon-containing film is formed by a dry film-formation technique using carbon.

In a preferable embodiment of the inventive micro-pattern formation process, said carbon-containing film is formed by sputtering or vapor deposition using carbon.

In a preferable embodiment of the inventive micro-pattern formation process, said carbon-containing film is formed by coating and drying of an aqueous solution containing a carbon-containing water-soluble substance.

In a preferable embodiment of the inventive micro-pattern formation process, said carbon-containing water-soluble substance is made of polyvinyl alcohol, polyethylene glycol or pasted starch.

DETAILED EXPLANATION OF THE INVENTION

The best mode for carrying out the invention is now explained in details.

The micropattern formation process of the invention is capable of forming patterns of size much finer than optically limited size. In particular, the invention is concerned with a micropattern formation process that less varies in the width of the ensuing fine size and is much improved in terms of controllability for maintaining fine size precision.

The steps of the inventive process are now each explained in greater details with reference to the drawings illustrative of one preferable example of the inventive micropattern formation process. FIGS. 1A, 1B, 1C and 1D are illustrative in section and schematic and over time of the inventive micropattern formation process. Note here that the micropattern exemplified below as a preferable example is a resist pattern; however, the formation of a thin-film micropattern using dry etching with this resist pattern as a mask, too, comes within the scope of right of the invention.

(1) Step of Readying up the Substrate that Provides a Substrate Material for the Formation of a Micro-Pattern First, a substrate 10 that provides the substrate material for the formation of a micropattern is readied up.

For the substrate 10, for instance, preference is given to a silicon substrate having a Ta or other film as a surface layer.

The following steps are applied directly or via a thin film to the substrate 10.

(2) Resist Pattern Formation Step

Figure 1A:
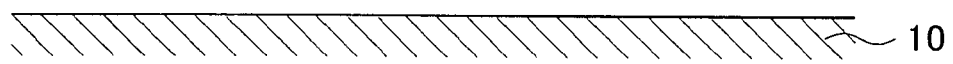
FIGS. 1A, 1B, 1C and 1D are illustrative in section over time of the inventive micropattern formation process.
Figure 1B:
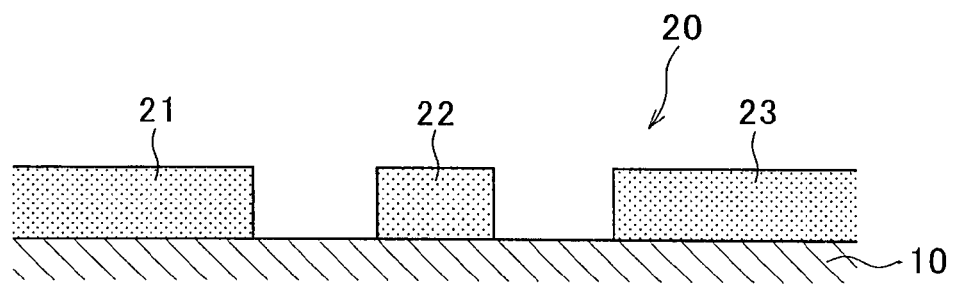

Then, as shown in FIG. 1B, a resist pattern 20 having a given pattern is formed on the substrate 10. Set out below is one examples of how to form the resist pattern 20.

That is, after a photoresist is coated on the substrate 10, using spin coating as an example, the photo-resist is heated (baked) if necessary to form a photo-resist film. Then, photolithography is used to apply patterning (selective exposure and development for pattern formation) to the photoresist film to form the resist pattern 20 (resists 21, 22, 23 in the illustrated example).

For a better understanding of illustration here, suppose a resist 22 at the center of FIG. 1B to be the projection (isolated line) to be slimmed down.

Figure 1C:
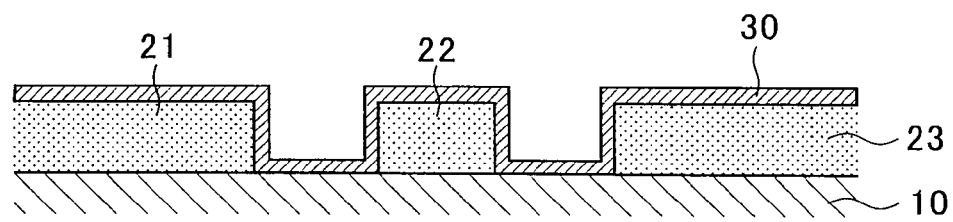

(3) Step of Forming the Carbon-Containing Film on the Surface of the Resist Pattern Then, as shown in FIG. 1C, a carbon-containing film 30 is formed on the surface of the resist pattern 20 (resists 21, 22, 23 in the illustrated example), and on the surface of the exposed substrate 10 as well.

The carbon-containing film 30 may as well be formed by (I) a dry film-formation technique using carbon, and (II) a technique wherein an aqueous solution containing a carbon-containing water-soluble substance is coated and thereafter dried.

With ease of film formation, film thickness, simplified steps, etc. in mind, it is preferable to rely upon the former dry film-formation technique. The dry film-formation technique is preferably implemented by sputtering or vapor deposition using carbon.

For the carbon-containing water-soluble substance in the coating step, for instance, polyvinyl alcohol, polyethylene glycol or pasted starch is preferably used in combination with spin coating, dipping coating or other coating processes.

As can also be understood from the specific experimental examples given below, the carbon-containing film 30 has preferably a thickness such that the resist ashing time comes to have a linear relation to the rate of width decrease so that the width decrease can be sensitively controlled. In other words, the film 30 may have a thickness enough to function as a trade-off layer to manage to get out of the so-called initial stage having an increased ashing rate.

(4) Ashing step

Then, the carbon-containing film 30 and a portion of the resist surface constituting the resist pattern 20 are ashed off in the ashing step.

Figure 1D:
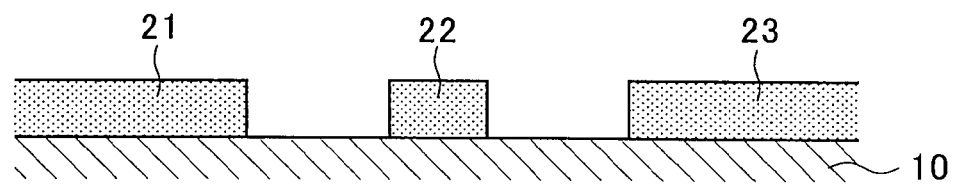

In the ashing step, the organics are exposed to plasma that contains at least oxygen to turn them into gases ($CO_2$, $H_2O$). In the invention, as shown in FIG. 1D, the carbon-containing film 30 and a portion of the resist surface constituting the resist pattern 20 vanish off with the result that slimming for the resist takes place.

As can be appreciated from the foregoing explanation, the invention involves the step of forming the resist pattern, then forming the carbon-containing film on the surface of the resist pattern, and thereafter ashing the aforesaid carbon-containing film and a portion of the resist surface constituting the aforesaid resist pattern. It is thus possible to stabilize the discharge state of ashing just after the initiation of discharge, thereby improving on the ashing rate distribution, and implementing sensitive pattern slimming with ease and high precision.

SPECIFIC EXAMPLES

The invention is now explained in further details with reference to some specific examples.

Experimentation of how to form the micropattern according to the invention was carried out in the following way.

First of all, there was a silicon substrate provided that had a size of 6 inches Φ and a thickness of 2 mm with a Ta film (of 50 nm in thickness) on its surface.

Then, a resist pattern was printed on the silicon substrate. More specifically, a liquid resist (PEK-505 made by Sumitomo Chemical Co., Ltd.) was spin coated at a thickness of 0.2 μm on the 50-nm Ta film, and then pre-baked at a temperature of 100° C. for 60 seconds to form a resist film.

Then, exposure, PEB and development were conducted under the following conditions:

[Exposure]
  Aligner: FPA5000ES4 from Canon Co., Ltd.
    (λ=248 nm, NA=0.8, σ=0.8)
  Dose: 30 mJ/$cm^2$
[PEB (Post Exposure Bake)]
  After exposure, baking was carried out at a temperature of 110° C. for 360 seconds.
[Development]
  With a developer made up of a 2.38% aqueous solution of TMAH (tetramethylammonium hydroxide), development was performed in one 60-second paddle.
Pattern size obtained: Isolated line of 150 nm in width and 5 μm in length
Pattern unit: one unit comprising a window of 5×20 μm (the Ta surface exposed to view due the absence of the resist) formed on each side of the isolated line (with the rest being all composed of the resist)

Such pattern units were located at substantially equal intervals and varied densities whereby the window area (the area where the Ta on the substrate surface was exposed to view: the aperture area) with none of the resist formed was adjusted to 5%, 8%, 10%, 12%, and 15% relative to the whole area of the substrate.

Then, a carbon film as the carbon-containing film was sputtered at a thickness of 5 nm on the resist pattern (which thickness was at the position of the side wall of the resist) in the following way.

[Formation of the Carbon-Containing Film]
  Sputtering system: Bias Sputter System (made by Hitachi Co., Ltd.)
  Target: Graphite carbon
  Sputtering gas: Ar (argon)

Then, ashing was implemented in the following way for removal of the carbon-containing film and a portion of the resist surface constituting the resist pattern.

[Ashing]
  Apparatus: System 104 made by Matrix Co., Ltd.
  Pressure: 133.322 Pa (1 Torr)
  Power: 100 W
  Gases used: Oxygen gas (at a flow rate of 15 sccm) Ar gas (at a flow rate of 5 sccm)
  Substrate temperature: 50° C.
  Ashing time: (see the following table)

Then, the resist widths of the isolated lines in the resulting resist pattern were measured in the following way.

[Measurement of the Resist Width]
  Using CD-SEM (critical-dimension scanning electron microscope), the width of the center site of the isolated line was measured.
  CD-SEM: S-7840 made by Hitachi Co., Ltd.
  Points of measurement: 128 points per substrate surface For the width size of the center sites of the isolated lines obtained at the 128 points, size variation distributions resulting from ashing were found from the following equation (1):

$$D=[(W_{max}-W_{min})/W_{ave}]\times 100\ (\%) \quad (1)$$

Here $W_{max}$ is the maximum value, $W_{min}$ is the minimum value, and $W_{ave}$ is the average value.

[Wrap-Up 1 of the Experimental Data]
  As set out in Table 1, what influences were brought in the size variation distribution (D) resulting from ashing was studied at the time when the changes in the proportion of the area except for the resist area were 5%, 8%, 10%, 12%, and 15%.

Note here that for the purpose of comparison, a comparative sample was prepared substantially following the process of the invention, with the exception that the carbon film as the carbon-containing film was not provided on the resist pattern.

It is also noted that the ashing time is defined by the period of time when the resist width at the center site of the isolated line decreased 20 nm, down to 150 nm to 130 nm. In other words, the ashing time for the inventive sample having the carbon film as the carbon-containing film was 56 seconds, whereas the ashing time for the comparative sample having no carbon film was 22 seconds.

The results are tabulated in Table 1.

TABLE 1

| | | Proportion of the area except for the resist area (the area where the Ta surface is exposed to view due to the absence of the resist) (%) | | | | |
|---|---|---|---|---|---|---|
| | | 5% | 8% | 10% | 12% | 15% |
| Size variation distribution from ashing (D) (%) | Inventive sample | 3 | 3 | 3 | 3 | 3 |
| | Comparative sample | 28 | 23 | 21 | 3 | 3 |

From the results of Table 1, it is found that even when the proportion of change in the area except for the resist area (the proportion of the aperture area) was 5%, 8%, 10%, 12%, and 15%, the inventive sample is free of any size variation distribution (D) resulting from ashing. When it comes to the comparative sample, by contrast, the size variation distribution (D) resulting from ashing grows very large, going worse as the proportion of the area except for the resist area (the proportion of the aperture area) is less than 12%. In the invention, the resist surface is made electroconductive so that the discharge state just after the initiation of discharge can be stabilized. This could have kept the size variation distribution (D) resulting from ashing very small, even though there was a decrease in the proportion of the aperture area.

[Wrap-Up 2 of the Experimental Data]

Regarding the inventive and comparative samples, set out in Table 2 is the wrap-up of the ashing time (sec.) vs. resist width decrease (nm) relations at the time when the proportion of the area except for the resist area (the proportion of the aperture area) was fixed at 8%.

TABLE 2

| | Resist width decrease (nm) | | |
|---|---|---|---|
| | | Inventive sample | |
| Ashing time (sec) | Comparative sample (having no carbon film) | Whole (carbon film + resist) | Resist site (calculated value) |
| 0 | 0.0 | 0.0 | — |
| 1 | 6.4 | 2.6 | — |
| 2 | 8.0 | 4.0 | — |
| 3 | 8.5 | 4.3 | — |
| 5 | 9.8 | 4.8 | — |
| 7 | 11.0 | 5.4 | — |
| 10 | 12.8 | 6.3 | — |
| 15 | 15.8 | 7.8 | — |
| 20 | 18.8 | 9.3 | — |
| 22 | 20.0 | 10.0 | 0.0 |
| 23 | — | 10.6 | 0.6 |

TABLE 2-continued

| | Resist width decrease (nm) | | |
|---|---|---|---|
| | | Inventive sample | |
| Ashing time (sec) | Comparative sample (having no carbon film) | Whole (carbon film + resist) | Resist site (calculated value) |
| 24 | — | 11.2 | 1.2 |
| 25 | 21.8 | 11.8 | 1.8 |
| 26 | — | 12.4 | 2.4 |
| 27 | — | 13.0 | 3.0 |
| 30 | — | 14.8 | 4.8 |
| 35 | — | 17.8 | 7.8 |
| 40 | — | 20.8 | 10.8 |
| 45 | — | 23.8 | 13.8 |
| 50 | — | 26.8 | 16.8 |
| 55 | — | 29.6 | 19.6 |
| 56 | — | 30.0 | 20.0 |
| 60 | — | 32.6 | 22.6 |

Figure 2:
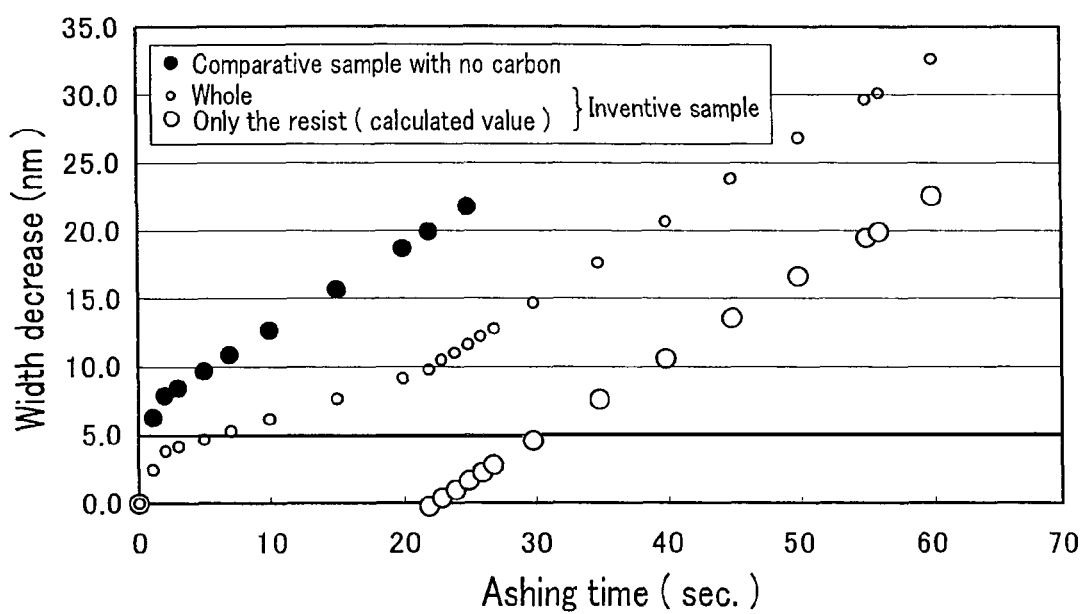
FIG. 2 is a graph indicative of pattern width decrease vs. ashing time relations in the inventive and comparative examples, respectively.

The results of Table 2 are plotted in the graph of FIG. 2.

From the graph of FIG. 2, it is appreciated that with the comparative sample wherein the resist is ashed as such with no provision of the carbon film, the rate of resist width decrease is faster in a period of time of about 1 to 2 seconds just after the initiation of ashing than that late in the ashing process. For this reason, it would be difficult to implement sensitive amounts of slimming.

In the inventive sample with the carbon film provided on it, by contrast, the carbon film is ashed at an initial faster rate, yet the resist pattern is not. At the time of resist ashing, the ashing time and the rate of width decrease have such linear relations as shown in FIG. 2 so that it is possible to gain sensitive control of width decrease.

From the aforesaid results of experimentation, the advantages of the invention would be undisputed.

That is, the micropattern formation of the invention comprises forming a resist pattern, and then forming a carbon-containing film on the surface of the resist pattern, followed by ashing of said carbon-containing film and a portion of the resist surface constituting said resist pattern. Thus, the discharge state of ashing just after the initiation of discharge is so stabilized that the ashing rate distribution can be improved, and sensitive pattern slimming can be implemented with ease and high precision.

What we claim is:

1. A process of forming a micropattern, comprising:
   forming an uneven resist pattern on a substrate or thin film upon a substrate; and then
   forming a carbon-comprising film on a surface of the uneven resist pattern and on a bare surface of the substrate or on a bare surface of the thin film; and thereafter,
   ashing away all of the carbon-comprising film and a portion of a resist surface constituting the uneven resist pattern, such that, in the ashing away, slimming of the resist pattern occurs.

2. The process of claim 1, wherein the forming of the carbon-comprising film is carried out by a dry film-formation technique with carbon.

3. The process of claim 2, wherein the dry film-formation technique is sputtering or vapor deposition.

4. The process of claim 1, wherein the forming of the carbon-comprising film is carried out by coating the surface with an aqueous solution comprising a carbon-comprising water-soluble substance, and then drying.

5. The process of claim 4, wherein the carbon-comprising water-soluble substance is polyvinyl alcohol, polyethylene glycol, or pasted starch.

6. The process of claim 4, wherein the coating is spin coating or dipping coating.

7. The process of claim 1, wherein the carbon-comprising film has a thickness such that a resist ashing time has a linear relation to a rate of width decrease of the resist pattern.

8. The process of claim 1, wherein the carbon-comprising film has a thickness 5 nm.

9. The process of claim 1, wherein the uneven resist pattern is upon a silicon substrate.

10. The process of claim 9, wherein the silicon substrate comprises a film comprising Ta upon it, in contact with the silicon substrate and beneath the resist pattern.

11. The process of claim 1, wherein the portion of the resist surface removed in the ashing decreases a width of the uneven resist pattern by 0.4% to 15.1%.

12. The process of claim 1, wherein the portion of the resist surface removed in the ashing decreases a width of the uneven resist pattern by 0.4% to 3.2%.

13. The process of claim 1, wherein variation in dimension of the resist pattern removed in the ashing is nearly constant over time.

14. The process of claim 1, wherein the forming of the carbon-comprising film is carried out by sputtering with graphite carbon.

15. The process of claim 1, wherein the ashing removes resist material at an approximately constant rate.

16. The process of claim 15, wherein the rate of removal of resist material is roughly equal in the first 10 seconds compared to the rate after 10 seconds.

17. The process of claim 1, wherein the ashing is carried out with a gas comprising oxygen.

18. The process of claim 1, wherein the ashing is carried out with a gas comprising argon.

19. The process of claim 1, wherein the uneven resist pattern is obtained by exposing a resist layer and developing the resist layer with alkaline solution, before forming the carbon-comprising layer upon the uneven resist layer.

20. The process of claim 1, wherein the ashing results in a slimming of the resist pattern with dimensional variation of not more than 3%.

* * * * *